United States Patent
Maeda

[11] Patent Number: 6,026,100
[45] Date of Patent: Feb. 15, 2000

[54] EXTERNAL CAVITY-TYPE OF WAVELENGTH TUNABLE SEMICONDUCTOR LASER LIGHT SOURCE AND METHOD FOR TUNING WAVELENGTH THEREFOR

[75] Inventor: Minoru Maeda, Tokyo, Japan

[73] Assignee: Ando Electric Co., Ltd., Tokyo, Japan

[21] Appl. No.: 09/092,266

[22] Filed: Jun. 5, 1998

[30] Foreign Application Priority Data

Jun. 6, 1997 [JP] Japan ................................. 9-149528

[51] Int. Cl.[7] ........................................... H01S 3/10
[52] U.S. Cl. ........................ 372/20; 372/102; 372/107; 372/92
[58] Field of Search ................... 372/20, 98, 92, 372/102, 100, 99, 107

[56] References Cited

U.S. PATENT DOCUMENTS

| | | | |
|---|---|---|---|
| 3,942,880 | 3/1976 | Zeiuders, Jr. | 372/99 |
| 5,297,155 | 3/1994 | Pan et al. | 372/20 |
| 5,331,651 | 7/1994 | Becker et al. | 372/20 |
| 5,347,527 | 9/1994 | Favre et al. | 372/20 |
| 5,450,428 | 9/1995 | Maeda | 372/20 |
| 5,493,575 | 2/1996 | Kitamura | 372/20 |
| 5,594,744 | 1/1997 | Lefevre et al. | 372/20 |
| 5,862,162 | 1/1999 | Maeda | 372/20 |

FOREIGN PATENT DOCUMENTS 3-279821 12/1991 Japan.

OTHER PUBLICATIONS

Boku, et al, "Ultra-narrowing of the Oscillation Linewidth from the External Cavity Diode Lasers", pp. 1–5.

*Primary Examiner*—Leon Scott, Jr.
*Attorney, Agent, or Firm*—Pillsbury Madison & Sutro LLP

[57] ABSTRACT

An external resonator type of wavelength tunable semiconductor laser light source comprises: a semiconductor laser provided with an anti-reflection film on one end facet thereof; a diffraction grating having a wavelength selection property, which is disposed in a side of the anti-reflection film of the semiconductor laser; and a wavelength tunable member for changing a position of the diffraction grating with respect to the semiconductor laser, to tune a wavelength of an oscillating light based on a movement of the diffraction grating, the wavelength tunable member comprises a supporting member a portion of which is fixed, a free arm of which supports the diffraction grating, and at least a part of which is an elastic body; a movement member for moving the supported diffraction grating by deforming the elastic body of the supporting member elastically; and a movement control member for controlling the amount of movement of the movement member.

11 Claims, 7 Drawing Sheets

EXTERNAL CAVITY-TYPE OF WAVELENGTH TUNABLE SEMICONDUCTOR LASER LIGHT SOURCE AND METHOD FOR TUNING WAVELENGTH THEREFOR

BACKGROUND OF THE INVENTION

1. Field of the Invention

The present invention relates to an external cavity type of wavelength tunable semiconductor laser light source, and a method for tuning wavelength therefor, which are used, for example, in an optical measurement technical field.

2. Description of the Related Art

In order to use a semiconductor laser light source for an optical measurement technique, one of single mode oscillation type, tunable in wavelength and having a narrow spectral line width and a good stability of wavelength, is required.

Figure 5:
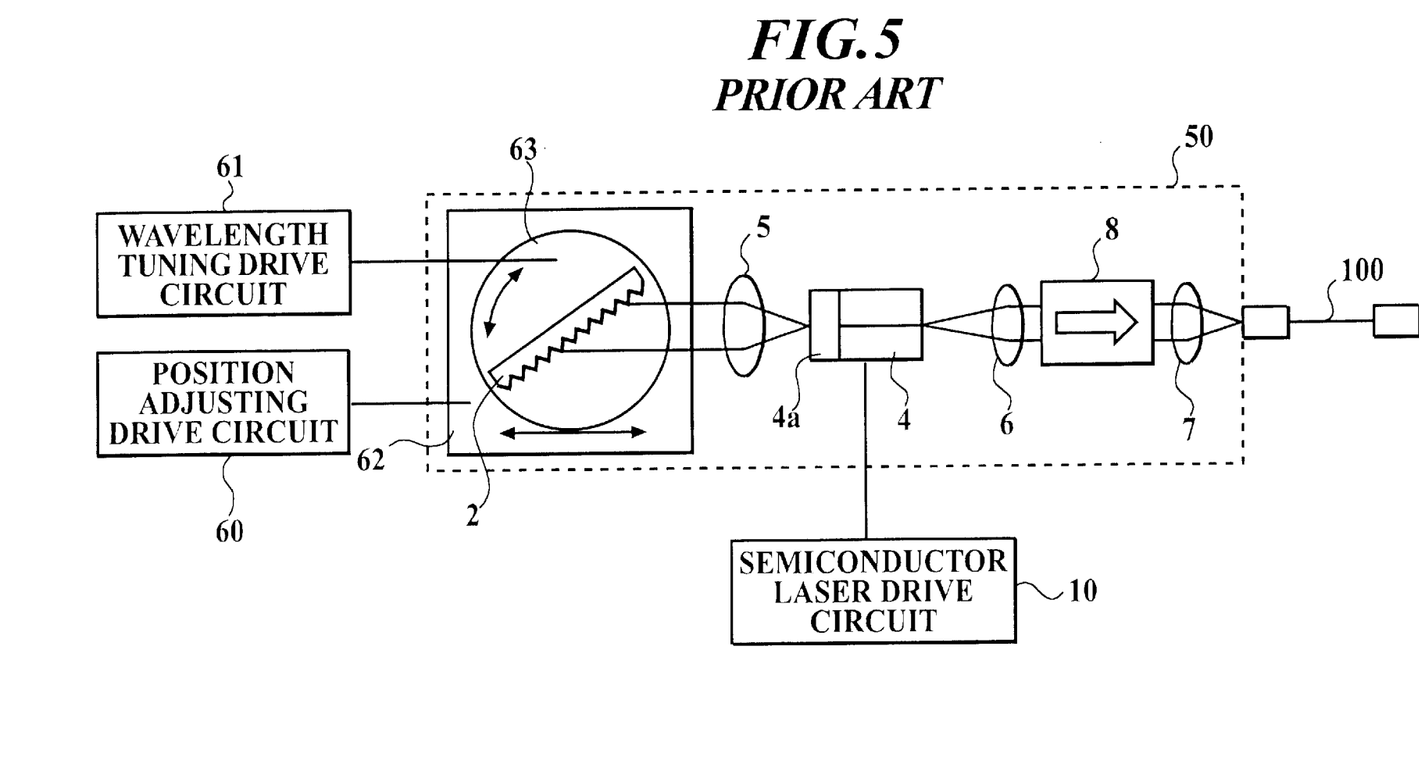
FIG. 5 is a block diagram showing a conventional general external resonator type of wavelength tunable semiconductor laser light source.
Figure 6:
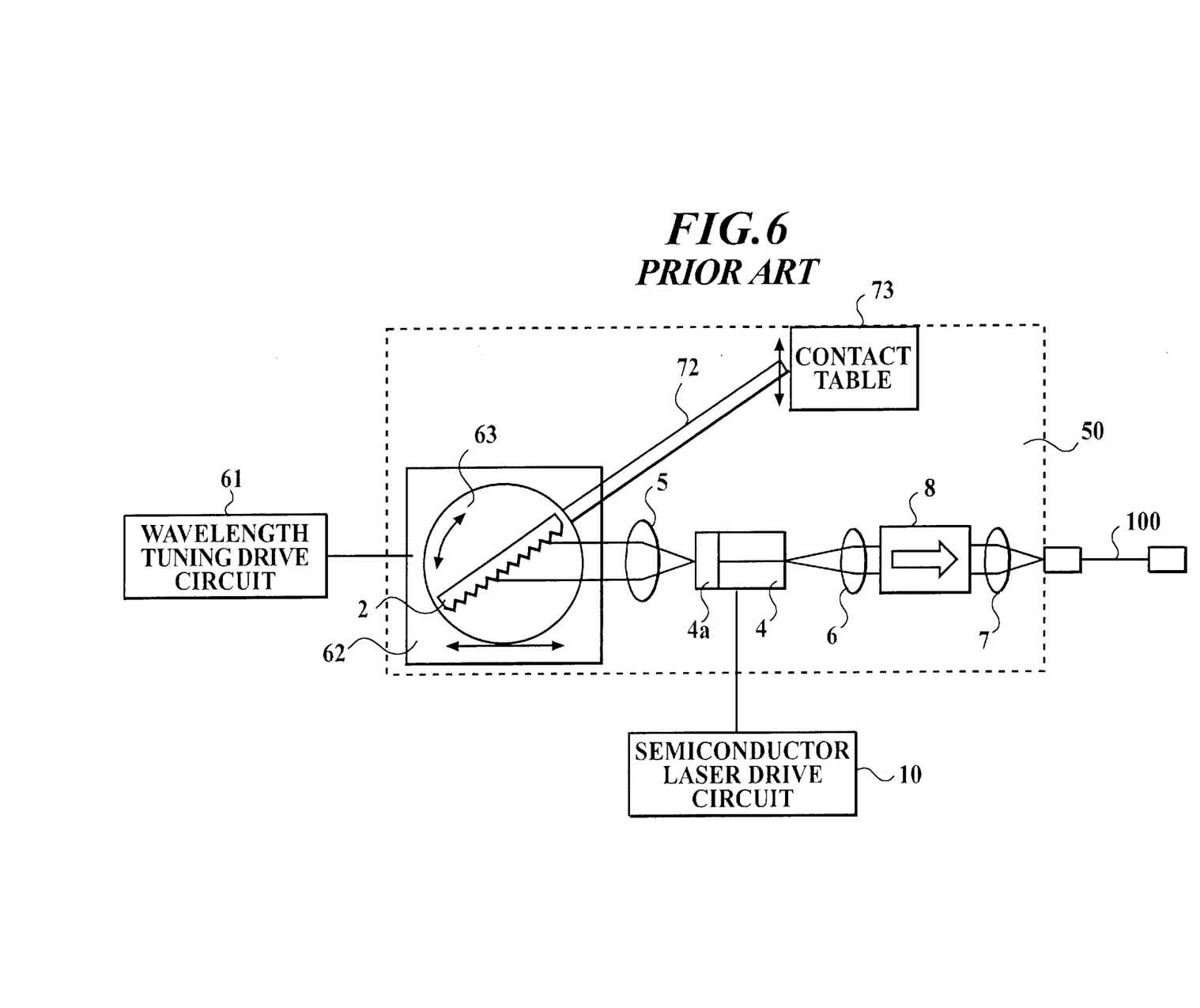
FIG. 6 is a block diagram showing another conventional external resonator type of wavelength tunable semiconductor laser light source having the so-called sine bar structure.
Figure 7:
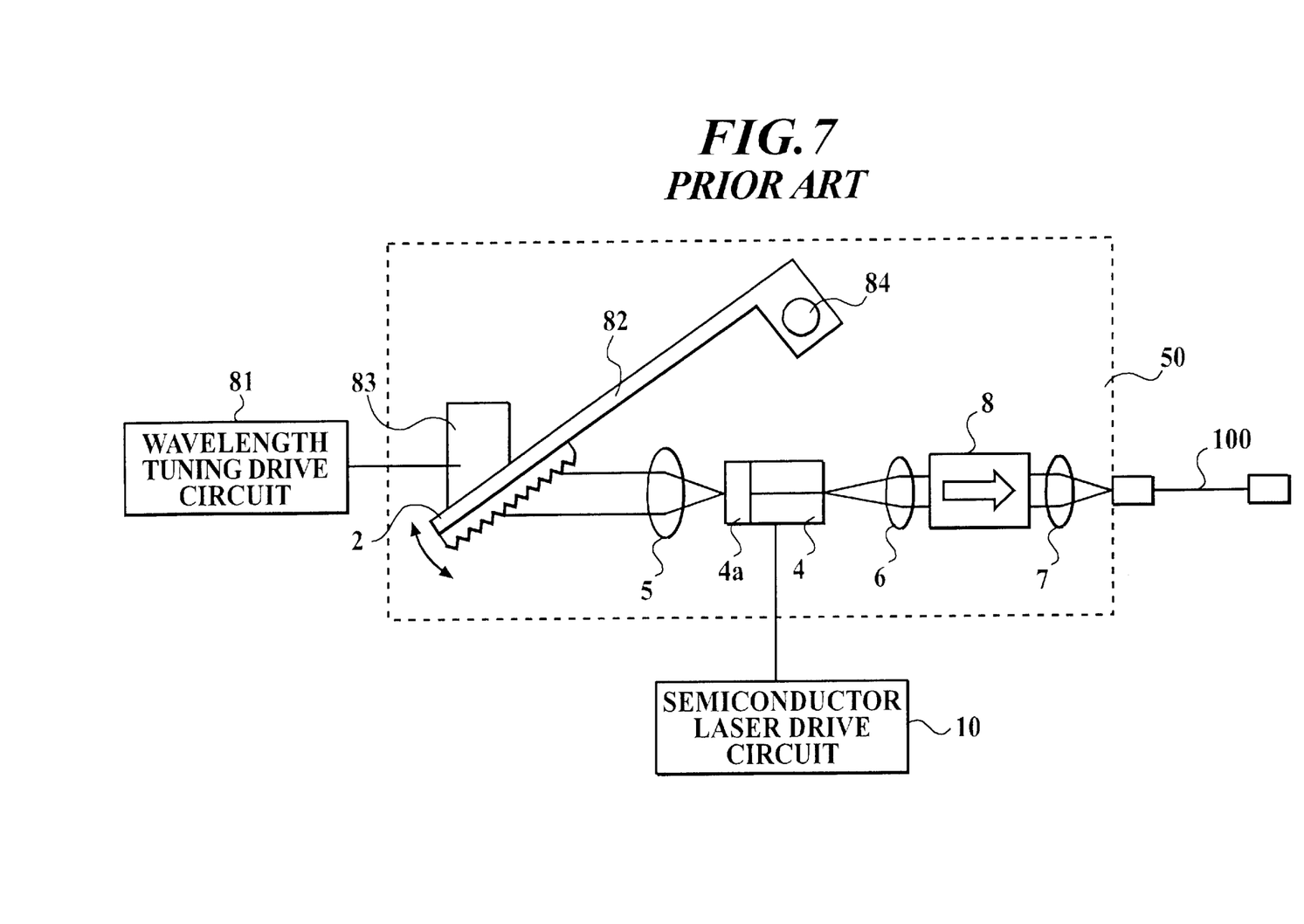
FIG. 7 is a block diagram showing a further conventional external resonator type of wavelength tunable semiconductor laser light source having a rotational arm structure.

As a conventional external resonator type of wavelength tunable semiconductor laser light source, for example, the ones shown in FIGS. 5 to 7 are known.

FIG. 5 is a block diagram showing a construction of a conventional general external resonator type of wavelength tunable semiconductor laser light source.

The external resonator type of wavelength tunable semiconductor laser light source comprises a semiconductor laser 4, a semiconductor laser drive circuit 10, lenses 5, 6 and 7, an optical isolator 8, a diffraction grating 2, an angle adjusting mechanism 63, a wavelength tuning drive circuit 61, a parallel movement mechanism 62, a position adjusting drive circuit 60 and the like.

The semiconductor laser 4 is of a Fabry-Perot type, and is provided with an anti-reflection film (AR coating) 4a on an end facet thereof. The semiconductor laser 4 emits a light beam from the both end facets according to the injection current given by the semiconductor laser drive circuit 10.

The light beam emitted from the end facet with the anti-reflection film 4a of the semiconductor laser 4 is changed to a collimated beam by the lens 5 to enter the diffraction grating 2.

The diffraction grating 2 is used as a wavelength selecting reflector, that is, it has a function of reflecting a light beam having a specific wavelength which is determined by the incident angle of the incident collimated light beam.

The diffraction grating 2 forms a resonator in cooperation with an end facet having no anti-reflection film of the semiconductor laser 4. Since the light beam having the specific wavelength which was selected by the diffraction grating 2 is reflected back to the semiconductor laser 4, a laser oscillation can be generated.

The lens 6 is placed on the exit optical axis of the side having no anti-reflection film of the semiconductor laser 4, in order to change the light beam emitted from the end facet of the semiconductor laser 4 to a collimated light beam. The emitted light beam which was changed to the collimated light beam enters the optical isolator 8.

The optical isolator 8 is for preventing a reflected light beam from an output fiber 100 side from returning back to the semiconductor laser 4. The light beam which was passed through the optical isolator 8 is condensed through the lens 7 and is introduced into the output fiber 100 as an output light beam.

The diffraction grating 2 is adjustable to have a desired angle with respect to the incident optical axis by the angle adjusting mechanism 63.

The angle adjusting mechanism 63 can be controlled by the wavelength tuning drive circuit 61, so that the diffraction grating 2 is rotated to have a desired angle and thereby a wavelength to be selected (Bragg wavelength) is desirably changed. Therefore, it is possible to tune the wavelength within the gain range of the semiconductor laser 4.

The diffraction grating 2 can be moved in parallel with the incident optical axis by the parallel movement mechanism 62. That is, by controlling the parallel movement mechanism 62 by the position adjusting drive circuit 60, the diffraction grating 2 is moved in a direction parallel with the optical axis of the resonator, so that the resonance wavelength of the resonator can be desirably changed.

By controlling the angle adjusting and the parallel movement, of the diffraction grating 2 at the same time by such mechanisms, it is possible to provide a continuous single mode scanning over a range of wavelengths without mode hopping.

In the structure of the construction of the external resonator type of wavelength tunable semiconductor laser light source shown in FIG. 5, it is extremely difficult to conduct a continuous scanning over a range of wavelengths without mode hopping by precisely drive-controlling both the angle adjusting and the parallel movement, of the diffraction grating 2 at the same time.

Because the angle adjusting mechanism 63 and the parallel movement mechanism 62 use a rotation stage and a linear movement stage and the like, a mechanical backlash may occur. Therefore, there is a problem that it is not possible to tune wavelength precisely.

Further, because use of a motor or the like, having precise gears built-in to control the mechanism precisely is required in addition to the rotation stage and the linear movement stage, there is a problem that a wavelength tuning mechanism becomes large in size.

As an example that the wavelength can be tuned without mode hopping by a simple drive control, a construction of a conventional external resonator type of wavelength tunable semiconductor laser light source of the so-called sine bar structure is shown in FIG. 6.

The external resonator type of wavelength tunable semiconductor laser light source comprises a semiconductor laser 4, a semiconductor laser drive circuit 10, lenses 5, 6 and 7, an optical isolator 8, a diffraction grating 2, an angle adjusting mechanism 63, a wavelength tuning drive circuit 61, a parallel movement mechanism 62, an arm 72, a contact table 73 and the like.

To structural members in FIG. 6, elements or the like corresponding to those shown in FIG. 5, the same reference numerals are attached, and the detailed explanation for them is omitted.

The parallel movement mechanism 62 is for adjusting the length of the external resonator. The parallel movement mechanism 62 enables movement of the diffraction grating 2 in parallel with the optical axis by controlling of the wavelength tuning drive circuit 61.

The angle adjusting mechanism 63 is for adjusting the angle of the diffraction grating 2 with respect to the optical axis. When the diffraction grating 2 is moved in parallel with the optical axis by the parallel movement mechanism 62, the angle of the diffraction grating 2 is changed through the arm 72 which can slide in the direction of the arrow while being in contact with the contact table 73, at the same time.

As described above, according to the sine bar mechanism, it is possible to adjust both the angle of the diffraction grating 2 and the length of the external resonator at the same time only by a drive control for linear movement by using the wavelength tuning drive circuit 61. Accordingly, it is possible to carry out a continuous scanning over a range of wavelengths without mode hopping easily.

There is a report that a continuous wavelength tunable width of 80 nm has been already obtained. There is a product of the external resonator type of wavelength tunable semiconductor laser light source in which such a sine bar mechanism is used.

However, because such the mechanism requires use of two stages, i.e., the rotation stage as the adjusting mechanism 63 and the linear movement stage as the parallel movement mechanism 62, the backlash of these stages or the like becomes a big problem. Further, because two stages are used, there is the problem that the wavelength tuning mechanism is enlarged, like the example shown in FIG. 5.

As an example of an external resonator type of wavelength tunable semiconductor laser light source which uses no linear movement stage, for example, the one having a rotation arm structure which is disclosed in Japanese Patent Application Publication (not examined) No. Toku-Kai-Hei 3 (1991)-279821 is known. The construction of the one is shown in FIG. 7.

The external resonator type of wavelength tunable semiconductor laser light source comprises a semiconductor laser 4, a semiconductor laser drive circuit 10, lenses 5, 6 and 7, an optical isolator 8, a diffraction grating 2, a wavelength tuning control member 83, a wavelength tuning drive circuit 81, a rotation axis 84, an arm-shaped mechanism 82 and the like.

To structural members in FIG. 7, elements or the like corresponding to those shown in FIG. 5, the same reference numerals are attached, and the detailed explanation for them is omitted.

The diffraction grating 2 is mounted on the nose of the arm-shaped mechanism 82 having the rotational shaft, that is, rotational center 84. The angle (rotation) of the diffraction grating 2 and the length of the external resonator are adjusted at the same time by rotating the arm-shaped mechanism 82 by the wavelength tuning control member 83.

The wavelength tuning mechanism having such a rotational arm is smaller in size than the one using the linear movement stage and the rotation stage. The drive control therefor is also simpler. There is a report that a continuous wavelength tunable width of about 1 nm (optical frequency tunable width of 130 GHz) is obtained, which is extremely small compared with the one which obtained in the sine bar mechanism shown in FIG. 6.

But the rotational shaft 84 needs to use bearings for rotation and the like. Therefore, problems are remained, that is, an occurrence of backlash at the bearing portion, the large-sized bearing portion, and the like.

As described above, in the structure of the conventional external resonator type of wavelength tunable semiconductor laser light source which uses the rotation stage and the linear movement stage as the angle adjusting mechanism and the parallel movement mechanism, respectively, because it is hard to avoid mechanical backlash, precise wavelength tuning is very difficult.

Further, because in order to control the mechanism precisely, use of a motor having precise gears built-in is required in addition to the rotation stage and the linear movement stage, there is the problem of a large-sized wavelength tuning mechanism.

SUMMARY OF THE INVENTION

The present invention was developed in view of these problems.

An object of the present invention is to provide an external resonator type of wavelength tunable semiconductor laser light source which is small in size.

Another object of the present invention is to provide a method for tuning wavelength, which enables miniaturization of the light source which has little mechanical backlash when the wavelength is tuned and which enables continuous precise tuning over a range of wavelengths.

In order to solve the above objects, in accordance with one aspect of the invention, the external resonator type of wavelength tunable semiconductor laser light source comprises: a semiconductor laser provided with an anti-reflection film on one end facet thereof; a diffraction grating having a wavelength selection property, which is disposed in a side of the anti-reflection film of the semiconductor laser; and a wavelength tunable member for changing a position of the diffraction grating with respect to the semiconductor laser, to tune a wavelength of an oscillating light based on a movement of the diffraction grating, the wavelength tunable member comprising: a supporting member a portion of which is fixed, a free arm of which supports the diffraction grating, and at least a part of which is an elastic body; a movement member for moving the supported diffraction grating by deforming the elastic body of the supporting member elastically; and a movement control member for controlling the amount of movement of the movement member.

According to the invention, by moving the elastic body of the supporting member elastically by the movement control member based on the wavelength to be tuned, the diffraction grating which is hold by the supporting member is rotated. Accordingly, the angle of a reflection surface of the diffraction grating with respect to the optical axis of the semiconductor laser and the position of the diffraction grating on the optical axis are suitably changed at the same time. Therefore, it is possible to carry out the tuning of the wavelength without mode hopping.

In this case, the semiconductor laser has such a structure, for example, of a Fabry-Perot type. For the diffraction grating, for example, a wavelength selection reflecting mirror is preferable.

For the elastic body, a plate spring is preferable. However, it is not limited to this and any another member which can support the diffraction grating may be also used therefor.

For the movement member, for example, a motor or a piezo element is preferable. But any other member may be used, which can adjust electrically the amount of force applied to the elastic body of the supporting member continuously. Further, the movement member can be disposed at any position at which the elastic body of the supporting member can be elastically deformed in a predetermined direction, that is, a rotational direction of the diffraction grating.

Preferably, the movement member comprises a layered piezo element. In the light source having such a structure, by adjusting a voltage to be applied to the layered piezo element, the generation force of the layered piezo element can be changed, so that the amount of movement which is given to the diffraction grating supported by the supporting member can be adjusted continuously. Accordingly, it is possible to carry out precise tuning wavelength easily and correctly without occurrence of mechanical backlash.

Preferably, in the external resonator type of wavelength tunable semiconductor laser light source, the elastic body of the supporting member comprises a bimorph piezo element.

According to the light source having such a structure, because the diffraction grating is supported through the bimorph piezo element, it is possible to adjust the amount of movement continuously, which is generated on the bimorph piezo element (given to the diffraction grating), by adjusting the voltage to be applied to the bimorph piezo element. Therefore, it is possible to tune the wavelength of oscillating laser light easily and correctly.

Because the bimorph piezo element has both functions of the elastic body of the supporting member for supporting the diffraction grating and of the movement member for moving the diffraction grating, it is possible to miniaturize the external resonator type of wavelength tunable semiconductor laser light source.

Further, the external resonator type of wavelength tunable semiconductor laser light source may comprise the position detecting sensor for detecting a movement position of the piezo element.

According to the light source having such a structure, because the position detecting sensor for detecting the actual movement position of the piezo element is provided, it is possible to detect a hysteresis and change with the passage of time, which is specific to the piezo element. As a result, it is possible to correct the position of the piezo element and therefore to increase the reliability of the tuning wavelength.

As the position detecting sensor, not only the one in which a detecting element or the like detects the amount of movement of the piezo element, while being in contact with the piezo element, but also the one in which an optical detecting device or the like detects the amount of movement of the piezo element while being not in contact with the piezo element can be adopted. It is not limited to this, so long as the amount of movement of the piezo element can be detected, any type of the sensor may be used and provided at any place.

In accordance with another aspect of the present invention, the method for tuning wavelength of an external resonator type of wavelength tunable semiconductor laser light source which comprises a semiconductor laser provided with an anti-reflection film on one end facet thereof, and a diffraction grating having a wavelength selection property, which is disposed in a side of the anti-reflection film of the semiconductor laser; comprises the steps of: supporting the diffraction grating by an elastic mounting member; and moving the diffraction grating to have a desired position and a desired incident angle with respect to the semiconductor laser by an elastic force due to the elastic mounting member, to tune wavelength of an oscillating light of the semiconductor laser light source.

According to the method of the invention, by deforming the elastic mounting member elastically based on the wavelength to be tuned, the diffraction grating which is supported by the elastic mounting member can be rotated, while changing both the angle of the reflection surface of the diffraction grating with respect to the optical axis of the semiconductor laser and the position of the one on the optical axis at the same time. Therefore, it is possible to carry out a precise wavelength tuning without mode hopping.

As the elastic mounting member, a plate spring or the like may be used. However, any another member which can support the diffraction grating may be also used therefor. As the semiconductor laser and the diffraction grating, such a member with same variation as described above may be used.

Preferably, the movement of the diffraction grating by the elastic force is given by application of a voltage to the layered piezo element.

According to the method having such a step, by adjusting the voltage applied to the layered piezo element, the generated force in the layered piezo element is changed, so that the amount of movement which is given to the diffraction grating supported by the elastic mounting member can be adjusted continuously. Therefore, it is possible to tune the wavelength of the oscillating laser light easily and correctly without occurrence of the mechanical backlash.

Preferably, the elastic mounting member may comprise the bimorph piezo element, which is elastically deformed by the application of the voltage.

According to the method, because the diffraction grating is supported through the bimorph piezo element, it is possible to adjust continuously the amount of movement which is generated on the bimorph piezo element (given to the diffraction grating) by adjusting the voltage applied to the bimorph piezo element. Therefore, it is possible to tune the wavelength of the oscillating laser light easily and correctly.

Because the bimorph piezo element which supports the diffraction grating has the simple structure which rotates the diffraction grating to tune wavelength, it is possible to miniaturize the external resonator type of wavelength tunable semiconductor laser light source.

Further, a method for tuning wavelength of the external resonator type of wavelength tunable semiconductor laser light source comprises a step of detecting a movement position of the piezo element to output a detection signal, and a step of correcting the position of the piezo element on the basis of the detection signal.

According to the method having such steps, because the position detecting sensor detects the actual movement position of the piezo element, it is possible to detect the hysteresis and the change with the passage of time, which is specific to the piezo element. As a result, it is possible to correct the position of the piezo element and therefore to increase the reliability of the tuning wavelength.

For the position detecting sensor, such a member with same variation as described above may be used.

BRIEF DESCRIPTION OF THE DRAWINGS

The present invention will become more fully understood from the detailed description given hereinbelow and the accompanying drawings which are given by way of illustration only, and thus are not intended as a definition of the limits of the present invention, and wherein.

PREFERRED EMBODIMENT OF THE INVENTION

Embodiments of the external resonator type of wavelength tunable semiconductor laser light source in accordance with the present invention will be explained in detail with reference to FIGS. 1 to 4.

Figure 1:
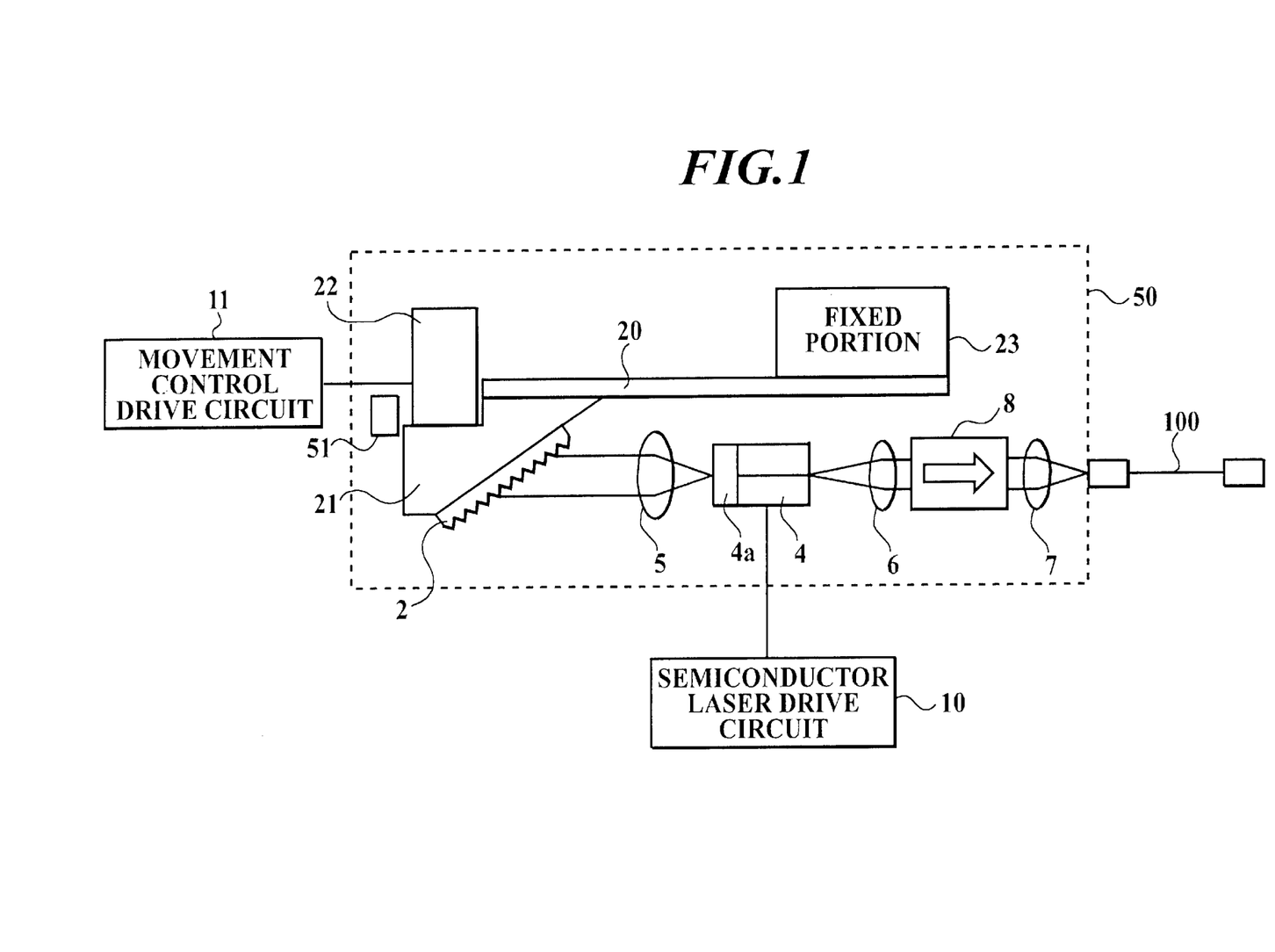
FIG. 1 is a block diagram showing an external resonator type of wavelength tunable semiconductor laser light source according to a first embodiment of the present invention.
Figure 2:
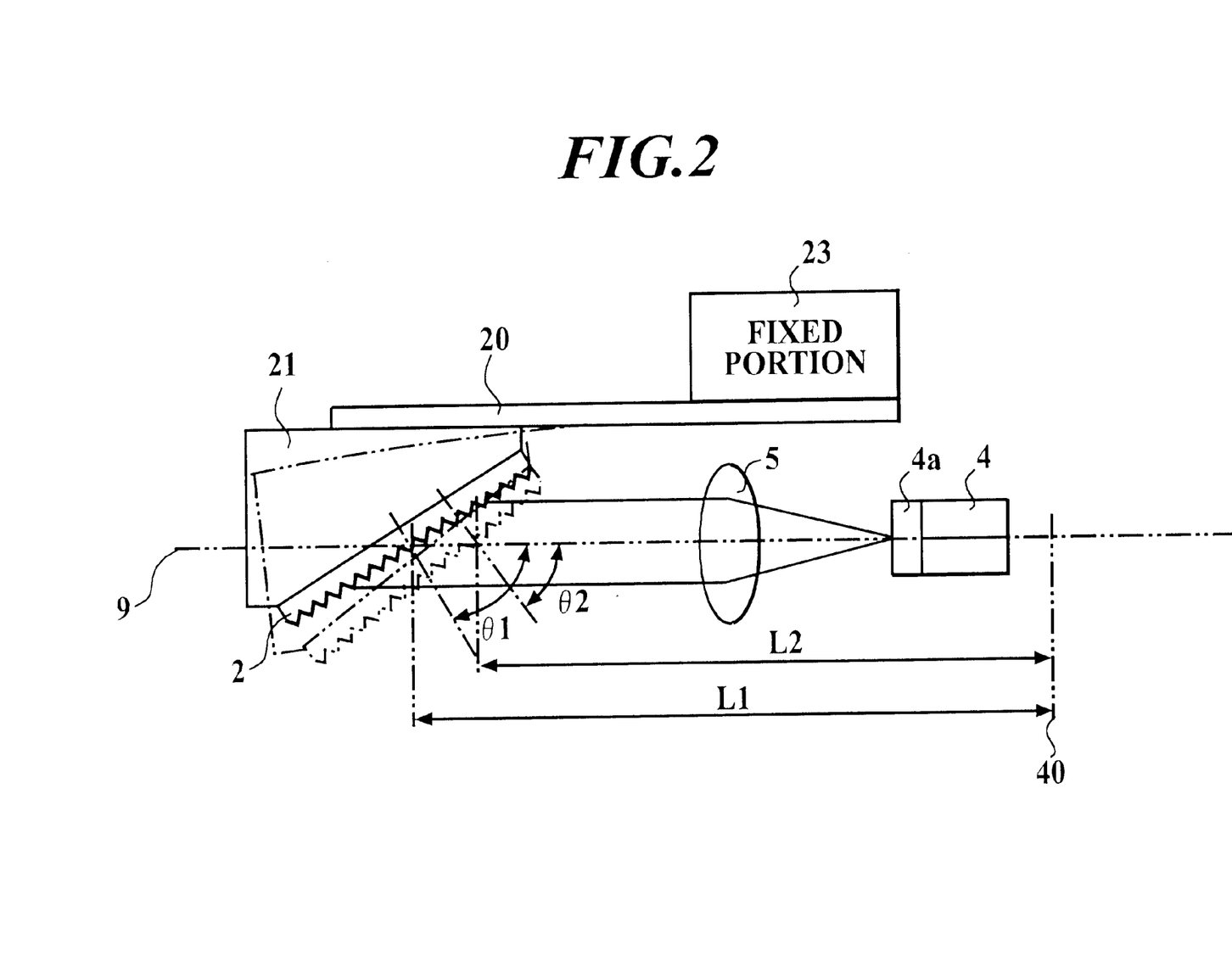
FIG. 2 is a block diagram showing a wavelength tuning mechanism of the external resonator type of wavelength tunable semiconductor laser light source according to the first embodiment of the present invention.

FIG. 1 is a block diagram of a structure of the external resonator type of wavelength tunable semiconductor laser light source in accordance with a first embodiment of the present invention, and FIG. 2 is a block diagram of a structure of the wavelength tuning mechanism of the external resonator type of wavelength tunable semiconductor laser light source in accordance with the first embodiment of the present invention.

The external resonator type of wavelength tunable semiconductor laser light source comprises a semiconductor laser 4, a semiconductor laser drive circuit 10, lenses 5, 6 and 7 which are disposed on an exit optical axis, an optical isolator 8, a diffraction grating 2, a wavelength tunable member which comprises a supporting member for supporting the diffraction grating 2, a movement member 22 for moving the supported diffraction grating 2, and a movement control member for controlling the amount of movement of the movement member 22, a sensor 51 which functions as a position detecting sensor and the like. The supporting member comprises a diffraction grating holder 21, a plate spring portion 20 as an elastic body of a supporting member and a fixed portion 23. The movement control member comprises a movement control drive circuit 11.

The semiconductor laser 4 is connected with the semiconductor laser drive circuit 10, and emits light beam from both end facets according to an injection current from the drive circuit 10. The lens 5 is disposed on the exit optical axis of the anti-reflection film 4a side of the semiconductor laser 4 and changes the light beam output from the end facet of the laser 4 to a collimated light beam. The output light beam which was changed to the collimated light beam enters to the diffraction grating 2.

The diffraction grating 2 functions as a wavelength selecting reflector. Only a light beam of a wavelength (Bragg wavelength) which is decided by an incidence angle θ among the collimated light beam which inputs with the incident angle θ is reflected back in a direction of the optical axis 9 of the semiconductor laser 4 by the diffraction grating 2. Accordingly, a light beam other than the one of Bragg wavelength is reflected in the direction of an angle which is different from the direction of the optical axis 9 of the semiconductor laser 4, so that the one is never reflected back to the semiconductor laser 4.

The lens 6 is disposed on the exit optical axis in the side in which the anti-reflection film of the semiconductor laser 4 is not provided and changes the light beam output from the end facet of the semiconductor laser 4 to a collimated light beam. The output light beam which was changed to the collimated light beam is introduced into the optical isolator 8.

The optical isolator 8 is for preventing reflected light from the output fiber 100 side from returning back to the semiconductor laser 4. The light beam which was passed through the optical isolator 8 is condensed through the lens 7 and is introduced into the output fiber 100 as the output light beam.

The wavelength tuning mechanism comprises the plate spring portion 20, the fixed portion 23, the diffraction grating holder 21, as the supporting member, the diffraction grating 2 and the like. The wavelength tuning mechanism changes the angle of the reflection surface of the diffraction grating 2 with respect to the optical axis 9 and a position of the diffraction grating 2 on the optical axis 9, by driving the movement member 22, as shown in FIG. 1. Therefore, the Bragg wavelength and a resonance wavelength are changed, as shown in FIG. 2.

An end of the plate spring portion 20 is fixed to an optical base 50 by the fixed portion 23, as shown in FIG. 1. To the free end of the plate spring portion 20, the diffraction grating 2 is mounted through the diffraction grating holder 21. When the plate spring portion 20 is bent elastically, the position of the diffraction grating 2 which is mounted to the free end side of the plate spring portion 20 is changed. Therefore, the angle of the reflection surface of the diffraction grating 2 with respect to the optical axis 9 of the semiconductor laser 4 and the length on the optical axis 9 between the diffraction grating 2 and the end facet of the semiconductor laser 4 are changed.

It is possible to carry out the continuous scanning over a range of wavelengths without mode hopping by optimizing the length of the plate spring portion 20, the fixed position of the fixed portion 23, the mounted position of the diffraction grating 2, and the like.

The movement member 22 is arranged in connect with the diffraction grating holder 21 and is controlled and driven by the movement control drive circuit 11, as shown in FIG. 1.

The movement member 22 comprises a layered piezo element and the like. The movement member 22 enables bending of the plate spring portion 20 through the diffraction grating holder 21 by controlling to drive the movement member 22 by the movement control drive circuit 11.

The above-described piezo element is an element of piezoelectric ceramics which has such characteristics that it is strained when an electric field is applied thereto, that is, the piezo element is an element providing a physical movement by application of a voltage, i.e., it contracts when a voltage is applied in the same direction as the polarization direction thereof, while it extends when the voltage is applied in the reverse direction of the polarization direction.

The layered piezo element comprises a lot of layered piezoelectric ceramics. It generates a large amount of force, although it provided a small amount of movement, by an application of the voltage. It is possible to adjust the amount of movement of the layered piezo element by changing the number of the layers.

As described above, because the amount of movement and the amount of generation force, which are generated on the layered piezo element, are changed by the voltage applied to the layered piezo element or the number of the layers, the force applied to the plate spring portion 20 through the diffraction grating holder 21 can be changed by adjusting the voltage to be applied and the number of the layers.

That is, by controlling the voltage applied to the layered piezo element, i.e., the movement member 22, by the movement control drive circuit 11, it is possible to control the amount of movement of the diffraction grating 2.

The sensor 51 is for detecting the amount of movement of the piezo element. A detected signal from the sensor 51 is output to the movement control drive circuit 11. Based on the detected signal, the movement control drive circuit 11 adjusts the voltage to be applied to the piezo element to correct the position of the piezo element, by detecting the movement of the piezo element caused by the hysteresis or the change with the passage of time thereof.

Any type of sensor may be used as the sensor 51 and it may be provided at any place, so long as the amount of movement of the piezo element can be detected.

The external resonator type of wavelength tunable semiconductor laser light source in accordance with the first embodiment is constructed as described above. Tuning wavelength of the oscillating laser light beam is carried out by using the external resonator type of wavelength tunable semiconductor laser light source, as follows.

First, the movement member 22 is driven by the movement control drive circuit 11 based on the wavelength to be tuned. That is, a required voltage is applied to the layered piezo element as the movement member 22 from the movement control drive circuit 11.

The plate spring portion 20 as an elastic mounting member is bent through the diffraction grating holder 21 by driving of the movement member 22, that is, by causing the generation force of the layered piezo element. As the result, the position of the diffraction grating 2 which is mounted to the diffraction grating holder 21 is changed as required in amount.

According to the change of the position of the diffraction grating 2, the angle between the normal axis with respect to the reflection surface of the diffraction grating 2 and the optical axis 9 is changed from θ1 to θ2, as shown in FIG. 2. Accordingly, a change of the Bragg wavelength can be obtained within the gain range of the semiconductor laser 4.

At the same time, according to the change of the position of the diffraction grating 2, the position on the optical axis 9, of the diffraction grating 2 is also changed. Consequently, the optical length of the resonator, that is, geometric distance between the diffraction grating 2 on the optical axis 9 and a virtual end surface 40 of resonator, which is obtained by considering the refractive index of the semiconductor laser 4, is changed from L1 to L2, so that the change of the oscillation wavelength can be also obtained, as shown in FIG. 2.

According to the external resonator type of wavelength tunable semiconductor laser light source in the first embodiment, because the position of the diffraction grating 2 which is mounted to the free portion of the plate spring portion 20 is changed by driving the movement member 22, i.e., by causing the generation force of the layered piezo element, so that the Bragg wavelength and the oscillation wavelength can be changed at the same time, it is possible to carry out continuous scanning over a range of wavelengths without mode hopping by easy controlling, like the conventional wavelength tunable light source which has the so-called sine bar structure or the rotation arm structure.

Because the wavelength tuning mechanism which has a plate spring structure supporting the diffraction grating 2 by the plate spring portion 20 carries out the tuning wavelength, the mechanical backlash which is occurred in the conventional rotation stage, the linear movement stage or the like is not occurred. As the result, it is possible to tune the wavelength with good reappearance.

Because a layered piezo element and a plate spring structure are used for the wavelength tuning mechanism, it is possible to miniaturize and lighten the mechanism extremely, compared with the conventional one which has a rotation stage and a linear movement stage.

When the piezo element is used for the movement member 22, because wavelength tuning can be carried out by analog-controlling the voltage applied to the piezo element, it is possible to use the light source as a slave light source which needs such a function to provide tracking for all accessible wavelengths with applied voltage.

Since the piezo element changes accompanied with hysteresis and change with the passage of time, the position of the piezo element can be corrected by feeding back the result detected by the sensor 51 to the movement control drive circuit 11, to increase the reliability of tuning wavelength.

In the first embodiment, although only an example in which a piezo element is used for the movement member 22 is shown, a motor can be also used for that. However, when the motor is used as the movement member 22, because a motor having precise gears built-in is required, there is a problem that the wavelength tuning mechanism becomes large in size.

A second embodiment of the external resonator type of wavelength tunable semiconductor laser light source in accordance with the present invention will be explained as follows.

Figure 3:
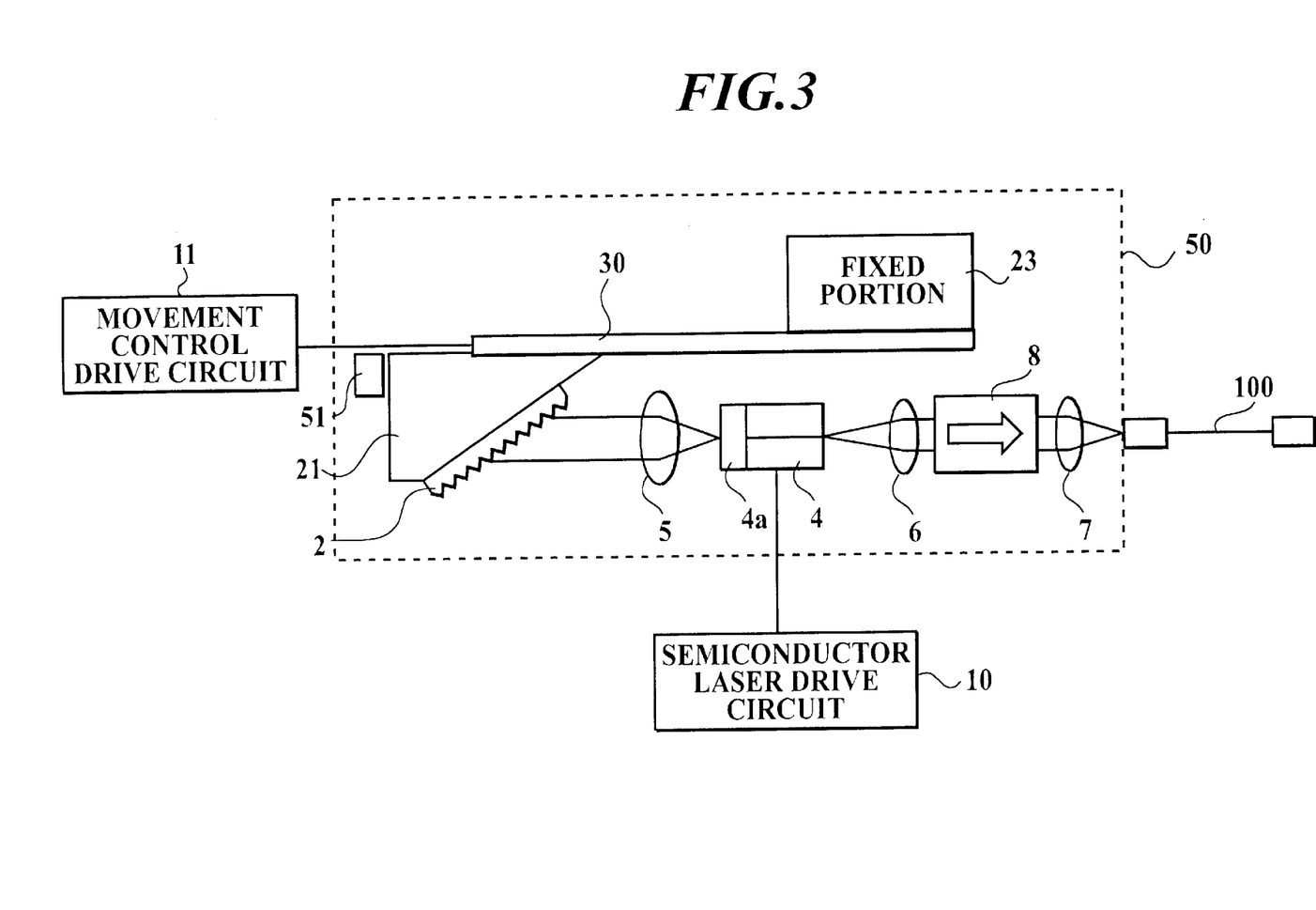
FIG. 3 is a block diagram showing an external resonator type of wavelength tunable semiconductor laser light source according to a second embodiment of the present invention.

FIG. 3 is a block diagram of a structure of the external resonator type of wavelength tunable semiconductor laser light source in accordance with the second embodiment of the present invention.

To structural members in FIG. 3, elements or the like corresponding to those shown in FIG. 1, the same reference numerals are attached, and the detailed explanation for them is omitted.

The external resonator type of wavelength tunable semiconductor laser light source of the second embodiment comprises the semiconductor laser 4, the semiconductor laser drive circuit 10, lenses 5, 6 and 7 which are disposed on the exit optical axis, the optical isolator 8, the diffraction grating 2, and a wavelength tunable member which comprises a supporting member for supporting the diffraction grating 2, a movement member 30 for moving the supported diffraction grating 2, a movement control member for controlling the amount of movement of the movement member 30 and the like. The supporting member comprises the diffraction grating holder 21, the fixed portion 23 and the movement member 30 as the elastic mounting member. The movement control member comprises the movement control drive circuit 11.

The movement member 30 comprises a bimorph piezo element which has both functions of the elastic body of the supporting member and the movement member. An end of the movement member 30 is fixed to the optical base 50 by the fixed portion 23. To the other free end of the movement member 30, the diffraction grating 2 is mounted through the diffraction grating holder 21.

The movement control drive circuit 11 controls driving of the movement member 30 and adjusts the voltage applied to the bimorph piezo element, on the basis of the wavelength to be tuned.

Figure 4:
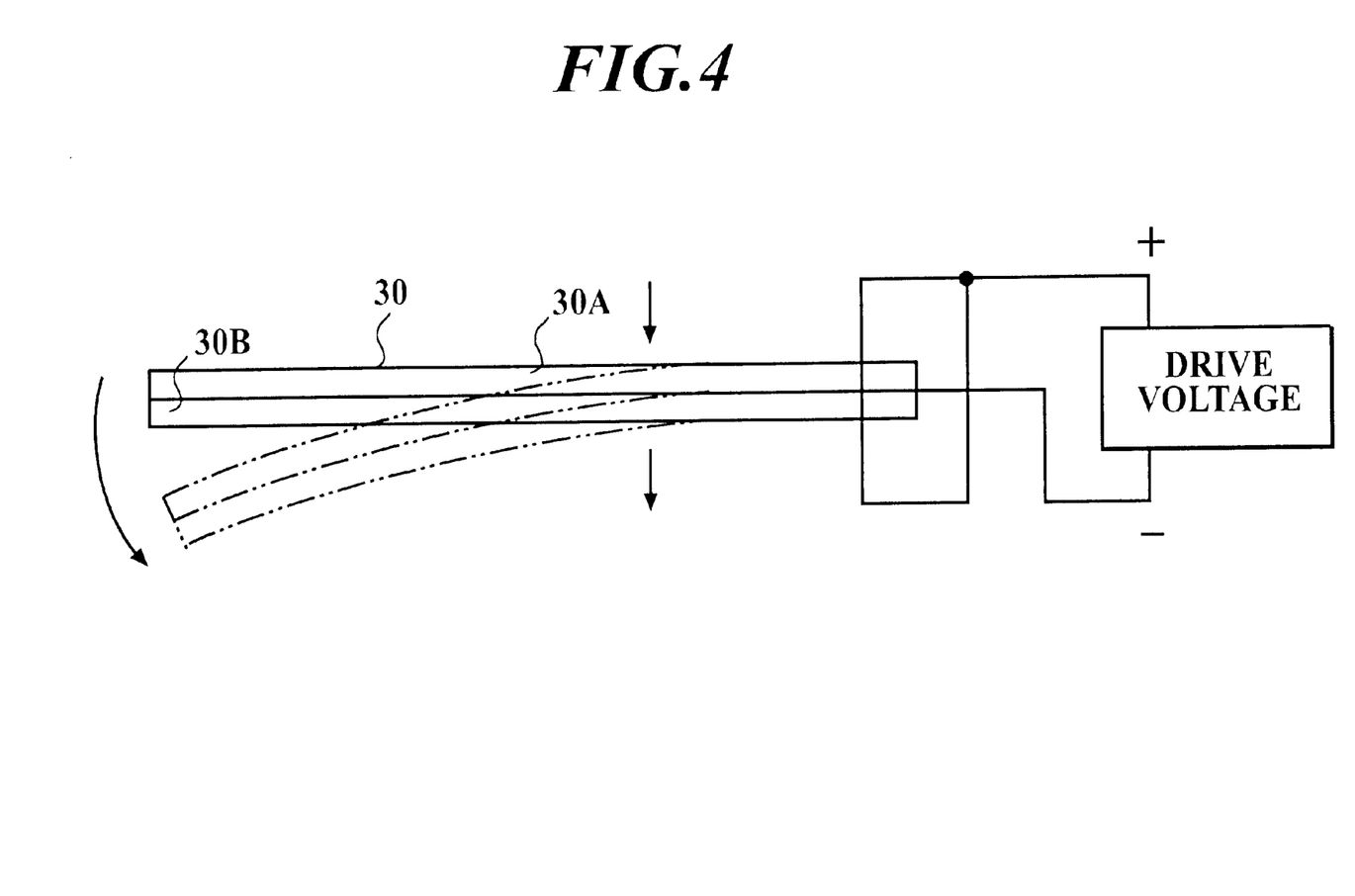
FIG. 4 is a view for explanation the function of a bimorph piezo element as a movement member in the second embodiment of the present invention.

FIG. 4 shows a working feature of a parallel type bimorph piezo element as the movement member in the second embodiment.

The parallel type bimorph piezo element as the movement member 30 is formed by laminating piezoelectric ceramics 30A and 30B together so as to have the same polarization direction. When applying the same voltage to electrodes on both outer surfaces which are not joined side, a voltage difference is generated between the electrodes on the outer surfaces and the inner laminated surfaces, so that the whole of the piezo element is bent to deform elastically.

Therefore, when the bimorph piezo element is deformed elastically by the application of the voltage in such a state that the end of the piezo element is fixed, the position of the other free end thereof moves greatly.

The bimorph piezo element is deformed elastically by controlling the voltage applied from the movement control drive circuit 11. Therefore, the movement member 30 comprising the bimorph piezo element can change at the same time the angle of the reflection surface of the diffraction grating 2 with respect to the optical axis 9 of the semiconductor laser 4 and the length on the optical axis 9 between the diffraction grating 2 and the end surface of the semiconductor laser 4.

That is, since the voltage applied to the bimorph piezo element (as the movement member 30) is controlled by the movement control drive circuit 11, it is possible to adjust the amount of movement of the diffraction grating 2 and to tune the wavelength of the oscillating light.

There are a series type of bimorph piezo element and the parallel type thereof, which is decided according to the polarization directions of the laminated piezoelectric ceramics. In the second embodiment, although the parallel type of bimorph piezo element is used, the series type thereof may be also used. A bimorph piezo element having a structure of a metal plate laminated to a piezoelectric element may be also used.

As described above, according to the external resonator type of wavelength tunable semiconductor laser light source in the second embodiment, because the bimorph piezo element is used as the wavelength tuning mechanism, it is possible to further simplify and miniaturize the structure of the wavelength tuning mechanism, in addition to the effects like those of the first embodiment above-described.

Although the generation force of the bimorph piezo element is small, when the voltage is applied, the amount of movement of several hundreds μm is obtained, which is larger than that of the layered piezo element. Therefore, because the changeable range of the movement of the diffraction grating becomes wider, it is possible to tune the wavelength in wide range.

The supported position and angle, of the diffraction grating 2 are adjustable. By adjusting these according to the tuning range of wavelength of the oscillating light, it is possible to carry out the continuous scanning over a range of wavelengths without mode hopping.

For the detail structures and methods described in embodiments, various changes and modifications may be made without departing from the spirit and scope of the present invention.

What is claimed is:

1. An external cavity-type wavelength tunable semiconductor laser light source comprising:
    a semiconductor laser having an anti-reflection film on one end facet thereof, a position of the laser defining a position of an optical axis;
    a diffraction grating positioned along the optical axis and disposed on an anti-reflection film side of the laser and for (i) receiving light beams emitted from the one end facet of the laser, and (ii) selecting a wavelength of a particular received light beam when a position of the diffraction grating with respect to the optical axis is changed; and
    a wavelength tunable member positioned in close cooperation with the diffraction grating and for (i) changing the position of the diffraction grating, (ii) the oscillating an output light beam emitted from an opposing end facet of the laser, oscillating based upon the wavelength of the particular light beam and the changed position, and (iii) tuning a wavelength of the oscillating output light beam,
    wherein the wavelength tunable member comprises:
        a supporting member for supporting the diffraction grating and having (i) an elastic body having a free end attached to a holding member, the holding member for attaching the diffraction grating thereto, the elastic body being deformed when the position of the diffraction grating is changed, and (ii) a fixed portion for fixing the elastic body to an optical base of the light source;
        a displacement member connected to the holding member and for moving the supported diffraction grating by deforming the elastic body; and
        a displacement control member for controlling an amount of displacement of the displacement means.

2. An external cavity-type wavelength tunable semiconductor laser light source as claimed in claim 1, wherein the displacement member comprises a layered piezoelectric element.

3. An external cavity-type wavelength tunable semiconductor laser light source as claimed in claim 2, further comprising a position detecting sensor for detecting a moved position of the layered piezoelectric element.

4. An external cavity-type wavelength tunable semiconductor laser light source as claimed in claim 1; wherein the elastic body comprises a bimorph piezoelectric element.

5. An external cavity-type wavelength tunable semiconductor laser light source as claimed in claim 4, wherein the elastic body is deformed in accordance with the amount of displacement of the displacement member.

6. An external cavity-type wavelength tunable semiconductor laser light source as claimed in claim 5, further comprising a position detecting sensor for detecting movement of the bimorph piezoelectric element.

7. A method for tuning wavelength of an external cavity-type wavelength tunable semiconductor laser light source which comprises a semiconductor laser provided with an anti-reflection film on one end facet thereof, and a diffraction grating positioned along the optical axis and disposed on an anti-reflection film side of the laser, the method comprising:
    supporting the diffraction grating by an elastic mounting member;
    moving the diffraction grating to a desired position and a desired incident angle with respect to the laser, moving (i) by applying an elastic force from the elastic mounting member, and (ii) to select a wavelength of a light beam emitted from the laser;
    oscillating an output light beam based upon the wavelength of the emitted light beam, the desired position, and the desired incident angle; and
    tuning the wavelength of the oscillating light beam.

8. A method for tuning wavelength of an external cavity-type wavelength tunable semiconductor laser light source as claimed in claim 7, wherein the movement of the diffraction grating is in response to application of a voltage to a layered piezoelectric element.

9. A method for tuning wavelength of an external cavity-type wavelength tunable semiconductor laser light source as claimed in claim 8, further comprising (i) detecting movement of the piezoelectric element to output a detection signal, and (ii) correcting the position of the piezoelectric element on the basis of the detection signal.

10. A method for tuning wavelength of an external cavity-type wavelength tunable semiconductor laser light source as claimed in claim 7, further comprising deforming a bimorph piezoelectric element of the elastic mounting member by applying of a voltage.

11. A method for tuning wavelength of an external cavity-type wavelength tunable semiconductor laser light source as claimed in claim 10, further comprising (i) detecting movement of the piezoelectric element to output a detection signal, and (ii) correcting the position of the piezoelectric element on the basis of the detection signal.

* * * * *